(12) United States Patent
Hasegawa et al.

(10) Patent No.: US 8,896,033 B2
(45) Date of Patent: Nov. 25, 2014

(54) ELECTROCHEMICAL TRANSISTOR

(75) Inventors: Tsuyoshi Hasegawa, Tsukuba (JP); Masakazu Aono, Tsukuba (JP); Kazuya Terabe, Tsukuba (JP); Tohru Tsuruoka, Tsukuba (JP); Yaomi Itoh, Tsukuba (JP)

(73) Assignee: National Institute for Materials Science, Tsukuba-Shi (JP)

( * ) Notice: Subject to any disclaimer, the term of this patent is extended or adjusted under 35 U.S.C. 154(b) by 0 days.

(21) Appl. No.: 13/816,584

(22) PCT Filed: Sep. 8, 2011

(86) PCT No.: PCT/JP2011/070440
§ 371 (c)(1),
(2), (4) Date: Feb. 12, 2013

(87) PCT Pub. No.: WO2012/039284
PCT Pub. Date: Mar. 29, 2012

(65) Prior Publication Data
US 2013/0140648 A1   Jun. 6, 2013

(30) Foreign Application Priority Data
Sep. 22, 2010 (JP) ................. 2010-211492

(51) Int. Cl.
| *G01N 27/403* | (2006.01) |
| *H01L 29/66* | (2006.01) |
| *H01L 27/148* | (2006.01) |
| *H01L 45/00* | (2006.01) |
| *G11C 13/00* | (2006.01) |
| *H01L 29/78* | (2006.01) |
| *G11C 13/02* | (2006.01) |

(52) U.S. Cl.
CPC .......... *H01L 29/78* (2013.01); *H01L 45/1266* (2013.01); *H01L 45/085* (2013.01); *G11C 13/0007* (2013.01); *H01L 45/1226* (2013.01); *H01L 45/146* (2013.01); *H01L 45/1206* (2013.01); *G11C 13/02* (2013.01); *G11C 2213/11* (2013.01); *G11C 2213/32* (2013.01); *G11C 13/0011* (2013.01)
USPC ............................ 257/253; 257/235; 257/236

(58) Field of Classification Search
CPC ................... H01L 21/823814; H01L 45/1266; H01L 45/085
USPC .......................................... 257/235, 236, 253
See application file for complete search history.

(56) References Cited

U.S. PATENT DOCUMENTS

| 6,737,316 B2* | 5/2004 | Lee ............................... 438/244 |
| 6,902,942 B2* | 6/2005 | Wu et al. ........................ 438/18 |

(Continued)

FOREIGN PATENT DOCUMENTS

JP    4156880 B2    9/2008

OTHER PUBLICATIONS

PCT, "International Search Report for PCT/JP2011/070440", Oct. 25, 2011.

(Continued)

Primary Examiner — Nicholas Tobergte
(74) Attorney, Agent, or Firm — Manabu Kanesaka

(57) ABSTRACT

The object of the invention is to provide a three-terminal switch (electrochemical transistor) capable of achieving sharp on-off operation.
A source electrode and a drain electrode are juxtaposed with an insulator interposed between them, and on the assembly there is an ion diffusion member such as $Ta_2O_5$ located. On the opposite surface of the ion diffusion member, there is a gate electrode located that is capable of supplying metal ions such as copper ions. By application of voltage to the gate electrode, the metal ions going out of the gate electrode are reversibly precipitated as metal on both source and drain electrodes as well as on the insulator near them, thereby controlling conduction and non-conduction between the source electrode and the drain electrode.

15 Claims, 7 Drawing Sheets

(56) References Cited

U.S. PATENT DOCUMENTS

| | | |
|---|---|---|
| 2006/0164880 A1 | 7/2006 | Sakamoto et al. |
| 2008/0036508 A1 | 2/2008 | Sakamoto et al. |
| 2009/0020742 A1* | 1/2009 | Sunamura et al. ............ 257/4 |
| 2010/0097735 A1 | 4/2010 | Nodin |

OTHER PUBLICATIONS

S. M. Sze, "Physics of Semiconductor Devices", WiLeyInter-Science.

Hisao Kawaura et al., "Three-Terminal Nanometer Metal Switch Utilizing Solid Electrolytes", IEEJ Journal C, vol. 128-C, No. 6, Jun. 2008, pp. 890-895.

* cited by examiner

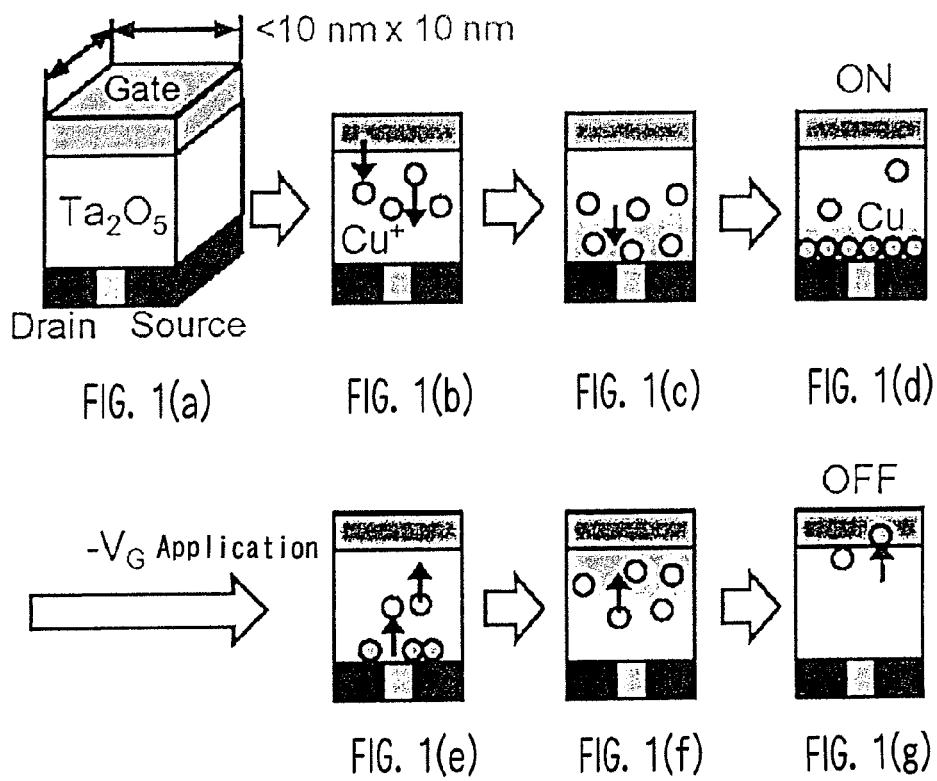

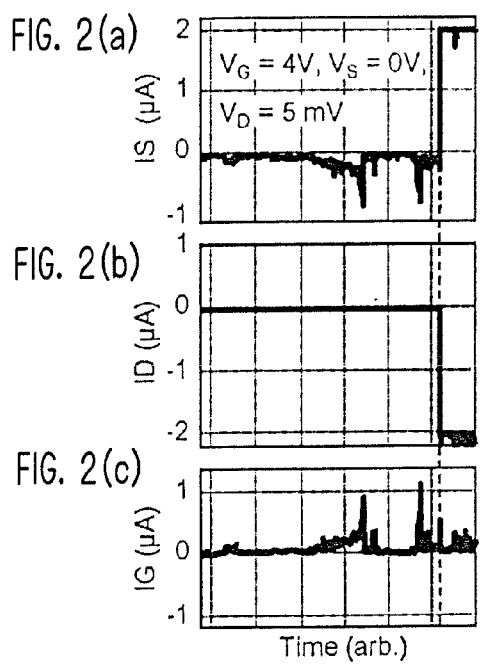
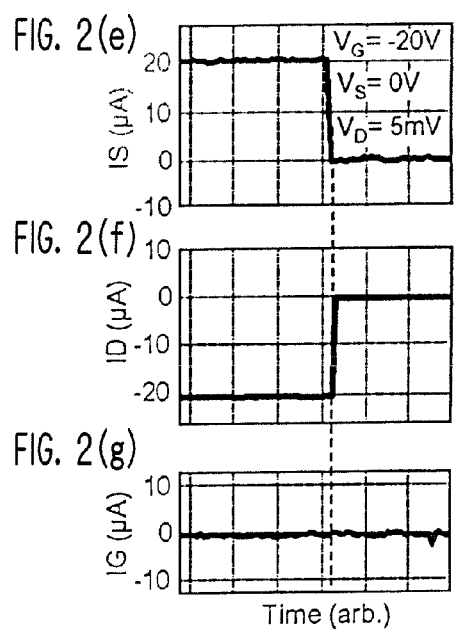
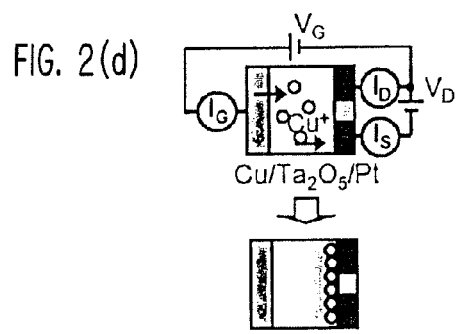
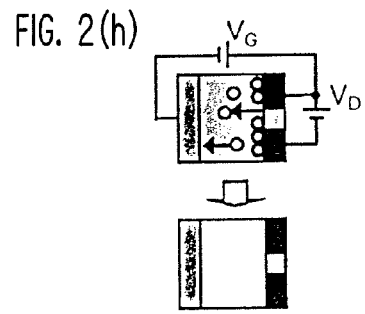

ELECTROCHEMICAL TRANSISTOR

RELATED APPLICATIONS

The present application is National Phase of International Application No. PCT/JP2011/070440 filed Sep. 8, 2011, and claims priority from Japanese Application No. 2010-211492, filed Sep. 22, 2010.

BACKGROUND OF THE INVENTION

1. Field of the Invention

The present invention relates to a three-terminal device capable of operating while electrical connection and disconnection between source and drain electrodes are controlled using a gate voltage.

2. Description of the Prior Art

When it comes to a three-terminal device that operates while gaining control of electrical connection and disconnection between source and drain electrodes using a gate voltage, there has a field effect semiconductor transistor so far known in the art. With the field effect semiconductor transistor, the distribution of electrons and holes in the semiconductor is controlled using an electric field induced by a gate voltage so that electrical connection and disconnection between the source and drain electrodes can be controlled. For instance, the operation principles are described at great length in Non-Patent Publication 1.

Among three-terminal devices that control the migration of ions for on-off operation, on the other hand, there has been a device known wherein a positive gate voltage is applied thereby moving metal cations to a source/drain electrode side so that an electrical connection can be made between source and drain electrodes. For its detailed operation principles, see Patent Publication 1. Another example is set forth in Non-Patent Publication 2. In this example, too, a positive gate voltage is applied to supply copper ions from a gate electrode to a source/drain electrode side so that the device can be put on. For its detailed operation principles, see Patent Publication 2.

With the aforesaid prior art field effect semiconductor transistors, any further improvement in performance would not been expectable, in part because there are much more increases in gate leakage currents as device size gets much smaller. For instance, the International Technology Roadmap for Semiconductor has revealed that field effect semiconductor transistors compatible with processing dimensions of less than 11 nanometers are very difficult to develop.

For this reason, three-terminal devices that may replace field effect semiconductor transistors are being enthusiastically developed. In the aforesaid Patent Publication 1 that shows a typical one of them, rather than control of electrons and holes, the distribution of metal cations in an ionic conductor (ion diffusion material) is controlled to achieve certain amount of electron conduction in the ionic conductor. Although this results in source/drain currents depending on gate voltages, it has been found that a problem that sharp on-off operation cannot take place remains unsolved because there is a continuous change in the distribution of metal cations depending on field strength, resulting in the continuous change in the source/drain currents.

According to the teachings of the aforesaid Patent Publication 2, by contrast, the metal ions are reduced on the source/drain electrodes, and metal filaments growing out of the source/drain electrodes couple together, achieving an on-state. In other words, the moment the filaments couple together, there is a decrease in the source/drain resistance, which results in the sharp on-off operation. However, there is another problem that the growth rate of filaments formed by the precipitation of metal ions depends on the value of the applied gate voltage; the gate voltage value at which the on-state is achievable also depends on the operation conditions such as the scan speed of gate voltage. To achieve faster operation, there is a need for using higher gate voltage to boost up the growth rate of filaments. In addition, continued application of the gate voltage causes a filament to be formed even between the gate electrode and the source electrode or the drain electrode, failing to make sure the insulation of the gate electrode.

To provide a solution to those problems, the aforesaid Patent Publication 2 teaches that the spaces between the gate electrode, the source electrode and the drain electrode are controlled such that a filament is formed between the source/drain electrodes before a filament is formed between them and the gate electrode. Even with such an improvement, however, there is still the need for controlling the application time of the gate voltage or the like, because continued application of the gate voltage causes a filament to be formed between the gate electrode and the source/drain electrodes. To put it another way, a problem with Patent Publication 2 is that the device cannot be used as a logic device because of arbitrary application of gate voltage required in the logic operation, so it cannot be a possible replacement of field effect semiconductor transistors.

LISTING OF THE PRIOR ARTS

Patent Publications

Patent Publication 1: U.S. Pat. No. 4,156,880 entitled "Field Effect Transistors"
Patent Publication 2: JP(A) 2006-339667 entitled "Switching Device, Rewritable Logic Integrated Circuit, and Memory Device"

Non-Patent Publications

Non-Patent Publication 1: Physics of Semiconductor Devices (S. M. Sze, WiLeylnter-Science)
Non-Patent Publication 2: "Three-Terminal Nanometer Metal Switch Using Solid Electrolytes", IEEJ Journal C, 128(6), 890-895 (2008)

SUMMARY OF THE INVENTION

An object of the invention is to provide a three-terminal device "electrochemical transistor" that can overcome the aforesaid problems with the prior art, thereby making sure sharp on-off operation and the insulation of the gate electrode upon continued application of gate voltage.

According to one aspect of the invention, there is an electrochemical transistor provided, which is characterized by comprising an ion diffusion member, a gate electrode located on a first surface of said ion diffusion member, and a source electrode and a drain electrode, in which an insulator is interposed between them located on a second surface of said ion diffusion member that opposes to said first surface, wherein a gate voltage is applied to said gate electrode to diffuse metal ions in said ion diffusion member such that said metal ions are supersaturated on said source electrode and said drain electrode as well as on said insulator near said both electrodes to make electrical connection between said source electrode and said drain electrode by way of a metal precipitated by said supersaturation.

The thickness of said ion diffusion member between said first surface and said second surface may be 40 nanometers or less.

Said ion diffusion material may be a metal oxide or silicon oxide.

Said metal oxide may be a titanium oxide, a tantalum oxide, and a tungsten oxide or a mixed oxide thereof.

Said metal ions may be one or more species of ions selected from silver ions, copper ions and lithium ions, or mixed ions comprising multiple species thereof.

At least a part of said gate electrode may be formed of copper or silver.

Said metal ions may be such that metal atoms forming said gate electrode are ionized and diffused into said ion diffusion member.

A spacing distance between said source electrode and said drain electrode may be 20 nanometers or less.

A spacing distance between said source electrode and said drain electrode may range from 1 nanometer to 15 nanometers.

Silver ions and/or copper ions may be contained beforehand as metal ions in the material for said ion diffusion member.

When said gate voltage lies in a positive area relative to said source electrode and said drain electrode, electrical connection or disconnection may be made between said source electrode and said drain electrode.

When a source/drain reference gate voltage defining said gate voltage lies in a positive area relative to said source electrode and said drain electrode, nonvolatile electrical connection may be made between said source electrode and said drain electrode, and when said source/drain reference gate voltage lies in a negative area, said nonvolatile electrical connection may be eliminated.

By application of said negative area of said source/drain reference gate electrode, said precipitated metal may be ionized and diffused in said ion diffusion member toward said gate electrode to eliminate electrical connection between said source electrode and said drain electrode.

When said source/drain reference gate voltage lies in a positive first area, electrical connection may be made between said source electrode and said drain electrode, and when said source/drain reference gate voltage is then decreased to a positive or zero second area lower than said first area, it may cause elimination of said electrical connection made by said source/drain reference gate voltage lying in said first area, and wherein when said source/drain reference gate voltage lies in a third area higher than said positive first area, said nonvolatile electrical connection takes place.

The amount of said metal diffused as ion in said ion diffusion member and precipitated on said drain electrode and said source electrode as well as on said insulator near said both electrodes may be smaller than the amount of said metal making electrical connection between said source electrode or said drain electrode and said gate electrode.

Advantages of the Invention

With the invention, it is possible to achieve a three-terminal device "electrochemical transistor" that is capable of sharp on-off operation, and makes sure the insulation of the gate electrode even upon continued application of gate voltage.

BRIEF DESCRIPTION OF THE DRAWINGS

FIG. 1 is illustrative in schematic of the structure of Example 1 according to the invention.

FIG. 2 is indicative of the results of current measurement showing the on-off operation of the electro-chemical transistor of Example 1 according to the invention, and changes that take place correspondingly in the interior of the electrochemical transistor.

MODE FOR CARRYING OUT THE INVENTION

Figures 3A, 3B:
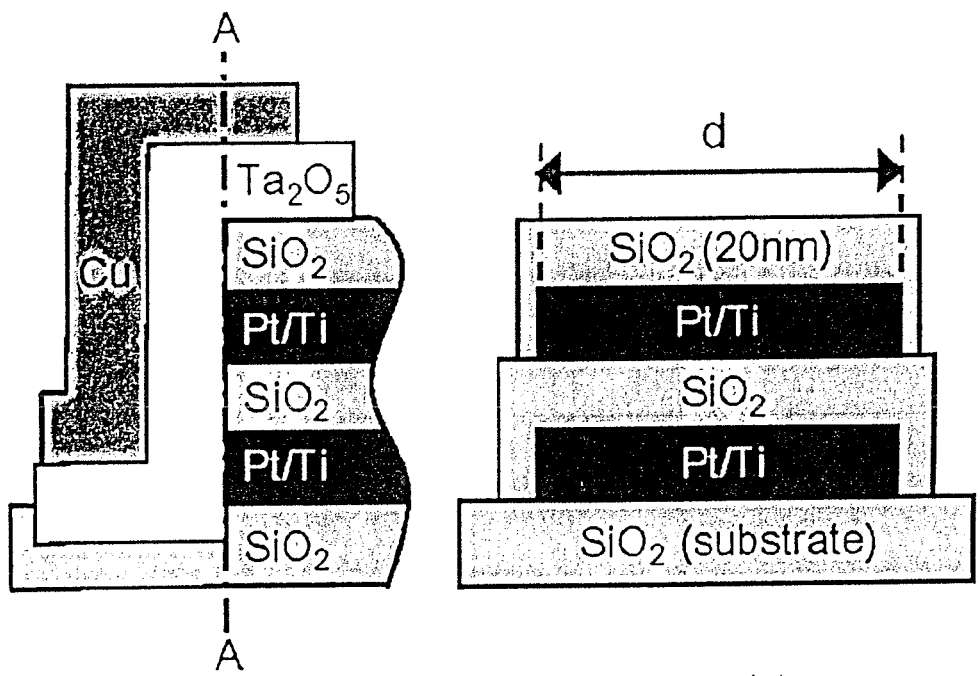
FIG. 3 is illustrative in schematic of the structure of the electrochemical transistor of Example 2 according to the invention.

In the invention, there is a three-terminal structure formed wherein the gate electrode is located on one surface of the ion diffusion member, and the source and drain electrodes mutually insulated by the insulator is located on another surface of the ion diffusion member. In what follows, the operation principles of the inventive electrochemical transistor will be explained with reference to some examples.

EXAMPLES

Example 1

FIG. 1 is illustrative of the schematic structure and operation principles of the electrochemical transistor of the first example according to the invention. In this example, tantalum oxide ($Ta_2O_5$) is used as the material for the ion diffusion member (hereinafter called the ion diffusion material), copper (Cu) as the gate electrode material, and platinum (Pt) as the material for the drain and source electrodes. Silicon oxide ($SiO_2$) is used as the material for the insulator that insulates between the source and drain electrodes.

As a positive gate voltage (the source/drain reference gate voltage relative to the source electrode and drain electrode; ditto) is applied to the gate electrode of the aforesaid arrangement, it causes the copper atoms forming the gate electrode to be oxidized (ionized) and supplied into the tantalum oxide that is the ion diffusion material (FIG. 1(b)). The copper ions supplied into the tantalum oxide are then diffused in the tantalum oxide toward the source electrode and drain electrode by virtue of an electric field induced in the tantalum oxide as the gate voltage is applied (FIG. 1(c)). As a consequence, the copper ions increases in concentration near the source electrode and drain electrode, and at the time the gate voltage reaches a certain value, they are supersaturated and precipitated as copper atoms (FIG. 1(d)). The thickness of the silicon oxide film insulating between the source electrode and the drain electrode (the spacing between the source and drain electrodes) is made so small that copper atoms are precipitated by supersaturation on the insulator (silicon oxide), too, between the source/drain electrodes and near the source/drain electrodes. As a result, the source electrode and the drain electrode are electrically connected together.

A unique feature of the invention is that the precipitation of metal atoms by the supersaturation phenomenon enables sharp on-operation. In addition, there is the need for applying an electric field of certain or larger magnitude to achieve the super-saturation phenomenon, so there is a certain critical value (threshold) on the on-state enabling gate voltage, which means that the on-state is always achievable at the same gate voltage value without depending on the application time of the gate voltage and scan speed.

Then, as a negative gate voltage is applied, it causes the copper atoms precipitated near the source/drain electrodes to be oxidized (ionized), and again diffused into the tantalum oxide that is the ion diffusion material toward the gate electrode (FIG. 1(e)). Consequently, the copper atoms contributing to the electrical connection between the source/drain electrodes disappear, ending up with electrical disconnection between the source/drain electrodes (FIG. 1(f)). Upon further continued application of the gate voltage, the copper ions supplied into the tantalum oxide that is the ion diffusion material are again reduced on the gate electrode into copper atoms, and captured in the gate electrode (FIG. 1(g)). Thus, the invention is designed such that the diffusion and the oxidation-reduction reaction of the metal ions in the ion diffusion material are controlled by the gate voltage thereby controlling electrical connection and disconnection between the source/drain electrodes.

FIG. 2 is illustrative of one example of the results of operation of the electrochemical transistor shown in FIG. 1. The results of operation shown in FIG. 2 are those of an electrochemical transistor that is fabricated using a 50-nanometer thick copper thin film as the gate electrode, a 30-nanometer thick tantalum oxide as the ion diffusion material, a 50-nanometer thick platinum thin film as the source electrode, and the drain electrode, and a 15-nanometer wide silicon oxide thin film (film thickness is measured in the spacing direction between the source electrode and the drain electrode) as the insulator material for insulating between the source electrode and the drain electrode.

With 0 V applied on the source electrode and 5 mV on the drain electrode, 4 V was applied on the gate electrode. Note here that the voltage applied on the source electrode and drain electrode may be at the same potential or may have a larger potential difference. In this example, a slight potential difference (5 mV) is provided for the purpose of obtaining real-time measurements of changes in the resistance between the source/drain electrodes in association with the application of the gate voltage. Shown in FIG. 2(a) are source current changes with time. It is seen that after the lapse of a certain time, the current value reaches 2 microamperes. At the same timing, the drain current value (FIG. 2(b)) reaches −2 microamperes. On the other hand, the gate current (FIG. 2(c)) shows a current value of generally a few tens of nanoamperes, although there are sometimes spiked current increases measured. From this, it is found that the measured current of 2 microamperes flows between the source electrode and the drain electrode, meaning that at the aforesaid certain time, they are electrically connected together.

Referring to the instant example, it is noted that there is some limitation imposed on the measuring system such that the maximum current becomes 2 microamperes. FIG. 2(d) is illustrative in schematic of the operation of the device corresponding to the current changes depicted in FIGS. 2(a), 2(b) and 2(c). As a voltage of 4 V is applied on the copper gate electrode, it causes the copper atoms forming the gate electrode to be ionized and diffused into the tantalum oxide toward the source/drain electrode side. As copper ions diffused in the vicinity of the source electrode and drain electrode grow super-saturated, it allows them to be precipitated as copper atoms to provide electrical connection between the source electrode and the drain electrode. Although the gate voltage of 4 V is applied, the gate current is on the order of a few tens of nanoamperes, meaning that the gate electrode is insulated on the order of gigaohm off the source/drain electrodes.

Then, as −20 V are applied on the gate electrode, it causes the source current value (FIG. 2(e)) and the drain current value (FIG. 2(f)) to fall down to less than nano-ampere at the same time after the lapse of a certain time, as can been from the drawings. In the meantime, the gate current (FIG. 2(g)) takes hold of a current value of the order of nanoampere. The operation of the device is shown in FIG. 2(h). As can be seen, the copper atoms providing electrical connection between the source electrode and the drain electrode are ionized and diffused toward the gate electrode side thereby providing electrical disconnection between the source electrode and the drain electrode.

As described above, the invention could provide electrical connection and disconnection between source/drain electrodes by varying the polarity of the voltage applied on the gate electrode. As can be seen from FIGS. 2(a), 2(b), 2(e) and 2(f), the electrical connection and disconnection takes place momentarily. This is a unique feature of the invention making use of precipitation taking place at the moment the copper ions become supersaturated.

While the 15-nanometer thick silicon oxide film is herein located between the drain electrode and the source electrode to space them away by that film thickness, it is to be understood that the device may run as an electrochemical transistor even when a distance as long as 20 nanometers is provided between both electrodes. To obtain good performance, however, it is preferable that the spacing distance between both electrodes is 15 nanometers or less. Note here that the distance between both electrodes becoming shorter than 1 nanometer is not that preferable because of increased leakage currents.

Example 2

In this example, the inventive electrochemical transistor will be explained with reference to its more specific structure as well as its fabrication process. The performance of the fabricated electrochemical transistor as measured will be shown.

FIG. 3 is illustrative of an exemplary, more specific structure of the electrochemical transistor with which the invention is achievable. FIG. 3(a) is a sectional view inclusive of the gate electrode, ion diffusion member, source electrode, drain electrode, etc., and FIG. 3(b) is a sectional view of FIG. 3(a) as taken on A-A inclusive of interface sites between the ion diffusion member and the source electrode, drain electrode and insulator (insulator film). However, it is to be noted that the $Ta_2O_5$ and Cu layers on the uppermost $SiO_2$ layer in FIG. 3(a) are left out.

The device structure herein comprises an insulating substrate ($SiO_2$) and a multilayered structure stacked thereon in which a Pt/Ti layer providing the source electrode and a Pt/Ti layer providing the drain electrode are stacked with the insulating film layer ($SiO_2$) interposed between them. Further on that multilayered structure, there is another insulating film layer ($SiO_2$) formed so as to limit a copper atom-precipitation area to between the source/drain electrodes. In the absence of the uppermost $SiO_2$ layer, the copper ions supplied from the gate are supersaturated even on the Pt/Ti layer for precipitation. There are thus problems that the copper atoms (ions) that are forced to move for on-off operation increase in number, slowing down on-off operation; the supplied ions grow large in number, resulting in increases in the electronic conductivity of the ionic conduction layer, which give rise to a lowering of off-state resistance and on-off ratios; and so on. For this reason, the $SiO_2$ layer is provided on the uppermost portion of the structure of FIG. 3 too. If there is the gate only on the side of the source/drain, the uppermost $SiO_2$ layer might be dispensed with; however, such device structure formation would be still difficult because of the decreased device size. A tantalum oxide layer is formed as the ion diffusion member on the side wall of this multilayered structure, and a copper thin-film layer is further formed as the gate electrode on the side wall of that ion diffusion member. Those layers may be formed by a general thin-film formation method such as a sputtering or electron beam evaporation process and a generally patterning method such as photolithography or electron beam lithography.

Figure 4A:
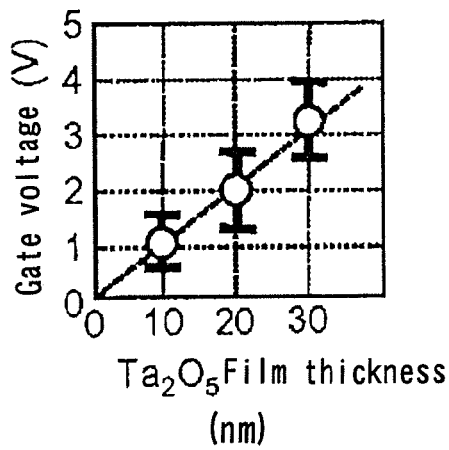
FIG. 4 is indicative of the results of measurement of the gate voltage and field strength necessary for the achievement of an on-state in the electrochemical transistor of Example 2 according to the invention.
Figure 4B:
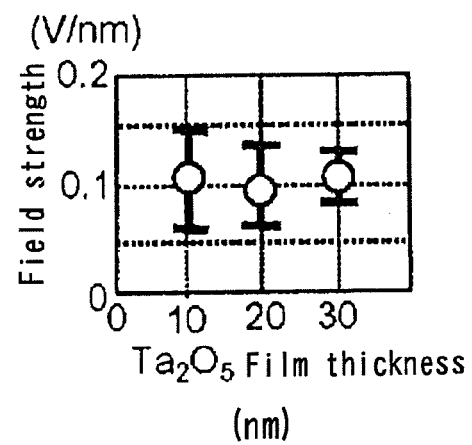

FIG. 4 is indicative of the operation features of an exemplary electrochemical transistor device having the device structure depicted in FIG. 3. FIG. 4(a) is indicative of the gate voltage value needed for making electrical connection between the source electrode and the drain electrode (or putting the instant transistor on). From FIG. 4(a), it can be seen that the gate voltage value necessary for providing electrical connection between the source electrode and the drain electrode is changing depending on the thickness of the tantalum oxide ($Ta_2O_5$) film. That is, the gate voltage value of 3 V on average is needed when the thickness of the tantalum oxide film is 30 nanometers, and as the thickness of the tantalum oxide film goes down to 20 nanometer and 10 nanometers, the necessary gate voltage value, too, falls down to 2 V→1 V on average. If this gate voltage value is divided by the thickness of the tantalum oxide film or it is indicated in terms of field strength (FIG. 4(b)), it is then found that whatever thickness, the necessary field strength is 0.1 V/nm on average. That is, the critical field strength for achieving the supersaturation of copper ions at the interfaces between the source and drain electrodes and the tantalum oxide becomes 0.1 V/nm. From this, it is found that if the tantalum oxide film is set at a thickness of 5 nm as an example, it is then possible to make electrical connection between the source electrode and the drain electrode at a gate voltage of 0.5 V. Note here that this critical voltage value is for copper used as the gate electrode material, viz., the ion species to be diffused, and for tantalum oxide used as the ion diffusion material, and so it varies with the diffusion ion species and ion diffusion material used.

It has also been found that when tantalum oxide is used as the ion diffusion material, the thickness of the tantalum oxide film must be set at 40 nanometers or less for the purpose of achieving operation at a practical voltage of 20 V (used on an integrated circuit) or less. Set forth in Example 1 is the operation of the device having a tantalum oxide film thickness of 30 nanometers. Its on-voltage is 4 V that roughly matches the aforesaid critical voltage value, whereas its off-voltage has a value of as high as −20 V. The reason is that as the tantalum oxide film gains thickness, an area where super-saturation occurs upon nonvolatile switch-on operation grows wide, resulting in precipitation of the metal than required. In other words, a large off-voltage is required to ionize a large amount of the precipitated metal atoms within a shorter period of time. There is a problem, too, that the operation speed is down for the reason that in order to achieve supersaturation, a larger amount of metal ions must be supplied into the ion diffusion material. It is thus preferable to set the film thickness of the ion diffusion member at 40 nanometers or less for the purpose of achieving good enough operation making sure both the on-voltage and the off-voltage become 20 V or less in terms of the absolute value.

Example 3

Figure 5A:
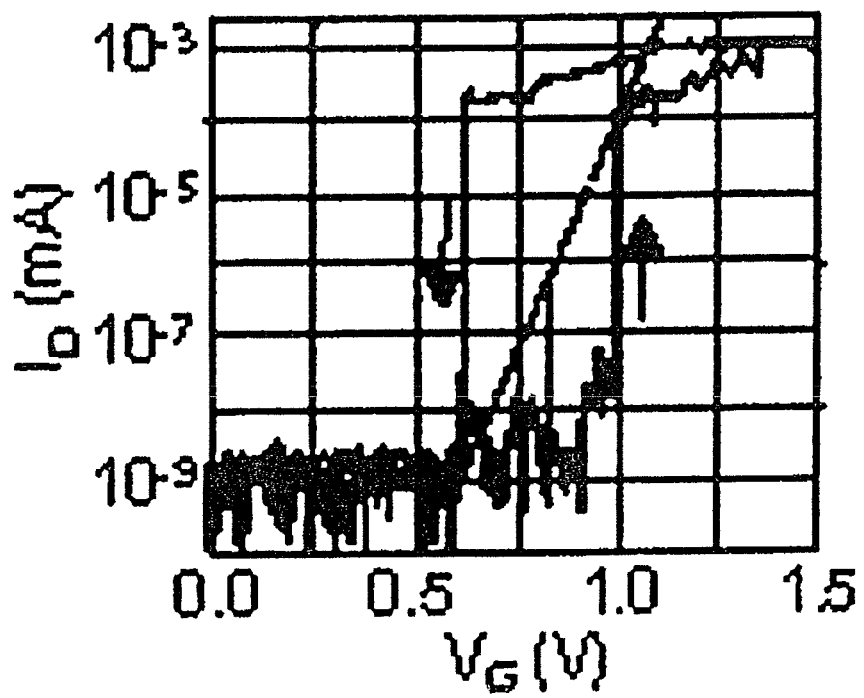
FIG. 5 is indicative of the results of measurement of drain current changes in the case of sweeping the gate voltage of the electrochemical transistor of Example 3 according to the invention.

In this example, the device operation based on the invention is explained in details with reference to the result of measuring a drain current in the case of sweeping the gate voltage. FIG. 5 is indicative of the results of measurements in the case where the tantalum oxide film thickness is set at 20 nanometers and copper is used as the gate electrode material. Referring to FIG. 5(a), the gate voltage was increased from 0 V up to 1.5 V, and swept again down to 0 V. As a result, the drain current increases sharply at a gate voltage of 1.0 V. The amount of change turns from $10^{-9}$ milliampere up to $10^{-3}$ milliampere, an astonishing six orders of magnitude. As the gate voltage was swept toward 0 V after increased up to 1.5 V, there was a sharp drain current down observed near 0.65 V. In the meantime, the gate current kept a magnitude of the order of nanoampere.

From the above results, it is found that as the gate voltage increases, it causes electrical connection to be provided between the source electrode and the drain electrode at a gate voltage 1.0 V, and as the gate voltage decreases, it causes electrical disconnection to be provided between the source electrode and the drain electrode at a gate voltage 0.65 V. In other words, it is appreciated that electrical connection between the source electrode and the drain electrode is formed only when the gate voltage has a certain or larger value, resulting in volatile operation. Referring to FIG. 5(a), it is a dotted line that connects the maximum and minimum values in the voltage/current area for effecting the on-state/off-state transition: that line corresponds to the so-called S factor in the field effect semiconductor transistor (the gate voltage necessary for increasing the drain current by one order of magnitude. From the results of operation shown in FIG. 5(a), it can be seen that the S factor achieved herein is 70 mV/decade sharply contrast to 100 mV/decade obtained with semiconductor transistors currently available in the art.

Figure 5B:
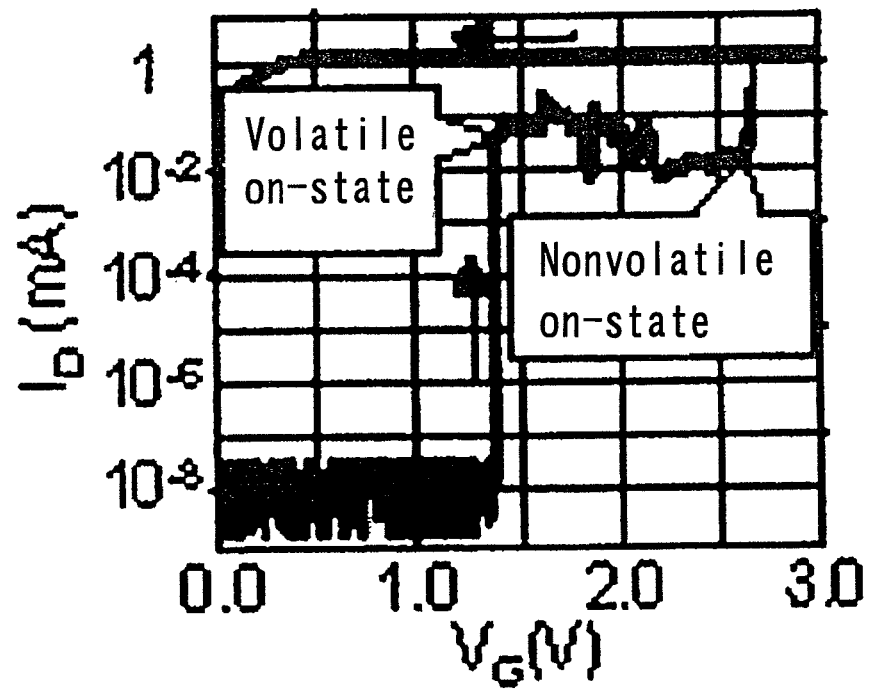

Shown in FIG. 5(b) are the results of sweeping the gate voltage with its maximum value set at 3 V. It can be seen that as the gate voltage increased from 0 V, it caused a sharp increase in the drain current at around a gate electrode of 1.4 V, with its amount of change turning from $10^{-8}$ milliampere up to $10^{-2}$ milliampere, an astonishing change up to six orders of magnitude. Upon a further continued voltage sweeping, there was a sharp increase again observed in the drain current at a gate voltage of 2.7 V. After the gate voltage was swept up to 3 V, it was allowed to go down to 0 V. Resistances between the source electrode, the drain electrode and the gate electrode were measured at a voltage (2 mV) which is small enough to hold back any state changes. It was found that there was electrical connection provided between the source electrode and the drain electrode at a resistance of barely 200 ohms. On the other hand, there was insulation between the gate electrode and the source electrode, and between the gate electrode and the drain electrode at a gigaohm or higher resistance. From these results, it is appreciated that the electrochemical transistor described herein is held in a nonvolatile on-state (even with the gate voltage set at zero, there is electrical connection kept between the source electrode and the drain electrode).

Note here that there are some noticeable differences between FIGS. 5(a) and 5(b) in terms of the threshold gate voltage, the current values before/after on-operation, etc., because different electrochemical transistors were used for measurements in FIGS. 5(a) and 5(b). In other words, an electrochemical transistor performs differently depending on variations in the sizes and physical properties of elements forming that electrochemical transistor, etc. Such variations would appear to be reduced through improvements in the fabrication process of electrochemical transistors and their size reductions. Judging from the results of measurements, in the electrochemical transistor used for the measurement of FIG. 5(b), the tantalum oxide film is considered to have had a thickness of about 28 nanometers.

From the results as described above, it is found that in one embodiment based on the invention, there are two types of on-states (electrically connected states between the source electrode and the drain electrode): volatile and nonvolatile, and that if the magnitude of the applied gate voltage is controlled, it is then possible to achieve two such on-states selectively. For instance, it is appreciated that when the tantalum oxide film has a thickness of 20 nm, the volatile on-state is achievable at a gate voltage of about 1 V to 1.5 V, and a nonvolatile on-state is achievable at a gate voltage of about 2 V to 3 V.

Figure 6:
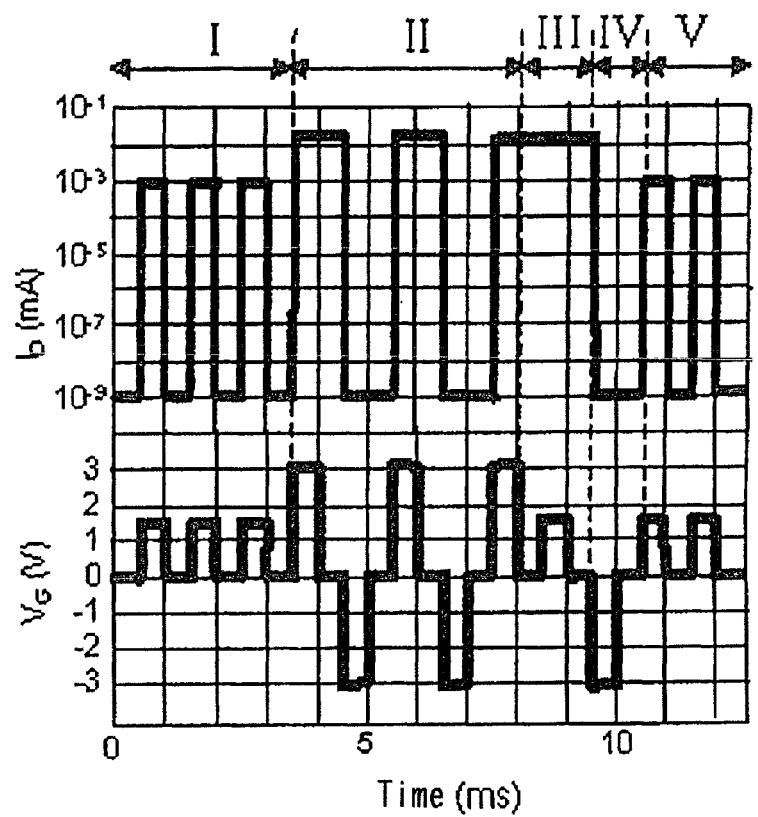
FIG. 6 is indicative of the results of operation of Example 3 according to the invention wherein volatile and nonvolatile on-states are selectively controlled.

The controlled operation of two types of on-states: volatile and nonvolatile is now explained with reference to FIG. 6. Such gate voltages as depicted on the lower side of FIG. 6 were applied to the device whose results are indicated in FIG. 5. More specifically, a gate voltage of 0 V or 1.5 V was applied in Area I; 3 V, 0 V or −3 V in Area II; 0 V or 1.5 V was again applied in Area III; 0 V or −3 V in Area IV; and 0 V or 1.5 V in Area V. The values of currents flowing between the source electrode and the drain electrode in the meantime are indicated in the upper side of FIG. 6. In Area I there is volatile operation running, and only as the gate electrode is 1.5 V, a current of as large as 1 milli-ampere is flowing between the source electrode and the drain electrode. In Area II there is nonvolatile operation running; and there is the on-state brought about by the application of the gate voltage of 3 V (a 10-milliampere current is flowing between the source electrode and the drain electrode), and that on-state is maintained even when the gate voltage goes down to 0 V. By letting the gate voltage down to −3 V, this on-state made a transition to the off-state (a current of 1 nano-ampere flowing between the source electrode and the drain electrode). In Area III the nonvolatile on-state remains constantly held irrespective of the gate voltage value, because the gate voltage necessary for volatile operation is applied to the device. In Area IV, by contrast, there is observed a transition to the off-state (the current value going from 10 milliamperes down to 1 nano-ampere) because of the application of the gate voltage value necessary for nonvolatile operation (that is −3 V: a voltage for making a transition from the nonvolatile on-state to the off-state). In Area V, there was observed operation similar to that in Area I because of the application of the gate voltage necessary for volatile operation to the device lying in that off-state.

As described above, with the invention it is possible to control the magnitude of the applied gate voltage thereby gaining selective control of volatile operation and nonvolatile operation.

Comparative Examples 1 and 2

The operations of two prior art devices are now explained in the form of Comparative Examples 1 and 2.

Figure 7A:
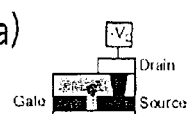
FIG. 7 is illustrative in schematic of the structure and operation of conventional electrochemical transistors without using any supersaturation state: Comparative Examples 1 and 2.
Figure 7B:
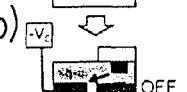
Figure 7C:
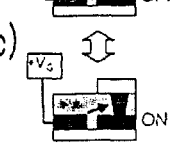

In Non-Patent Publication 2, there is a report about the operation of a three-terminal switch in which copper sulfide is used as the ionic conductor (ion diffusion material), copper as the material for the gate and source electrodes, and platinum as the drain electrode material. In this example, a metal nano-filament made up of copper atoms is formed beforehand between the drain electrode and the source electrode (FIG. 7(a)). Then, a proper voltage is applied between the source electrode and the drain electrode to cut off a part of the metal nano-filament (FIG. 7(b)). Thereafter, a proper voltage is applied to between the gate electrode and the source/drain electrodes so that copper ions supplied from the gate electrode make reconnection between the cut metal nano-filaments thereby providing electrical connection between the source electrode and the drain electrode (FIG. 7(c)). This junction itself is finer than the filament formed between the source electrode and the drain electrode; as the voltage of opposite polarity is applied to it, it is preferentially cut, resulting again in the achievement of an off-state (FIG. 7(b)). In this example, additional copper atoms are precipitated on the surface of the copper filament formed between the source electrode and the drain electrode, resulting in re-coupling of the cut filaments. In a way, the filament grows thick or gets fine so that the filament is cut off at its fine portion or the cut filaments are re-coupled, resulting in the achievement of on-off operation.

Figure 7D:
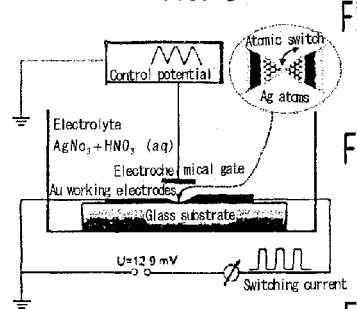

Similar switching operation is achieved in an electrolyte too, as shown schematically in FIG. 7(d). In this example, there are two gold electrodes located in an aqueous solution containing silver nitrate, and voltage is again applied to a gate electrode located in an electrolyte to control a potential in the electrolyte thereby controlling precipitation of silver atoms on the surfaces of the gold electrodes. Precipitation of silver atoms causes the gold electrodes to gain thickness, eventually ending up with coupling of silver filaments extending out of two gold electrodes (see the sketch on the right upper portion of FIG. 7(d)). If the potential applied to the gate electrode is controlled, it is also possible to re-ionize the precipitated silver atoms to capture them in the silver nitrate solution for the achievement of the off-state.

Figure 7E:
Figure 7F:
Figure 7G:

In both comparative examples as described above, on-off operation is controlled by way of precipitation and dissolution of the metal atoms on the surfaces of the source and drain electrodes, as shown schematically in FIGS. 7(e), 7(f) and 7(g). Precipitation and dissolution take place at a relatively small voltage (for instance, about 0.1 V for precipitation of copper out of the copper sulfide). In the case of scanning the gate voltage, at what gate voltage a transition to the on-state is made depends largely on the scan speed of the gate voltage. Referring back to the comparative examples shown in FIGS. 7(a), 7(b) and 7(c), as the voltage remains applied to the gate electrode even after the achievement of electrical connection between the source electrode and the drain electrode, it will provide electrical connection between the gate electrode and the source or drain electrode too. In some cases, there is a problem that before electrical connection is formed between the source electrode and the drain electrode, electrical connection will be formed between the gate electrode and the source electrode or the gate electrode and the drain electrode. In this respect, Patent Publication 2 teaches that to avoid this, it is desired to make the distance between the gate electrode and the source electrode or the drain electrode greater than the source/drain electrode spacing. Even with such contrivance, however, if the gate electrode remains applied, the gate electrode is going to be electrically connected to the source electrode or the drain electrode.

Example 4

Set out below is an inventive example that enables the insulation of the gate electrode to be well held even as the gate voltage continues to be applied.

Figures 8A, 8B, 8C, 8D:
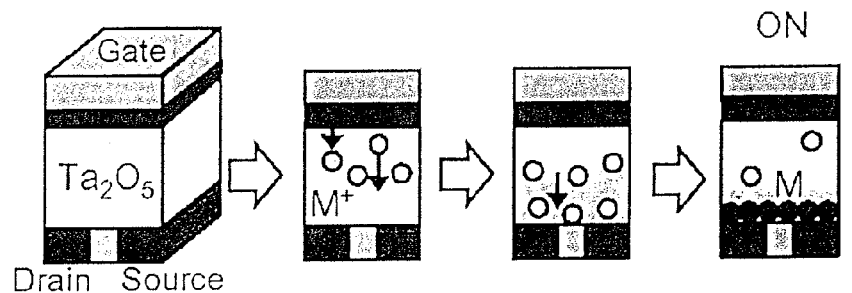
FIG. 8 is illustrative in schematic of the structure and operation principles of the electrochemical transistor of Example 4 according to the invention that ensures the insulation of the gate electrode to be kept even upon continued application of gate voltage.
Figures 8E, 8F, 8G:
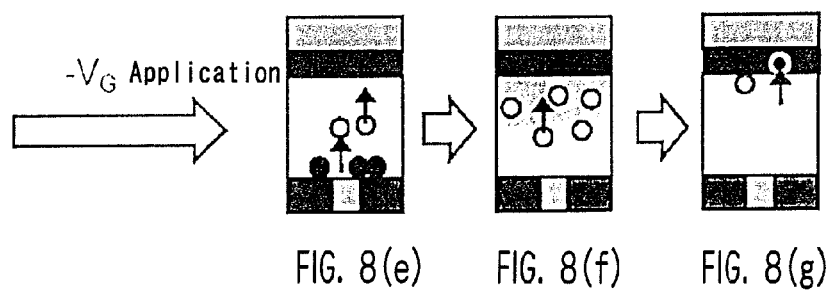

FIG. 8 shows a typical example of such an inventive electrochemical transistor. In this example, a tantalum oxide ($Ta_2O_5$) layer that is the ion diffusion member is formed on a source electrode and a drain electrode isolated by an insulating film ($SiO_2$), and further on that there are a copper thin-film layer and a platinum layer formed. The copper thin-film layer and platinum layer define together a gate electrode (FIG. 8(a)). The copper thin-film layer has a thickness of roughly 1 nanometer to 5 nanometers, although depending on the tantalum oxide film thickness and device structure. However, when the areas of the source and drain electrodes is large relative to the gate electrode area, that thickness may grow large to about 20 nanometers, and when the areas of the source and drain electrode are small relative to the gate electrode area, on the contrary, that thickness may get small to about a few nanometers. In short, the proper copper thin-film thickness changes with the device structure used, as explained just below.

As a positive voltage is applied to the gate electrode, it causes copper ions to be supplied from the copper thin film forming the gate electrode into the tantalum oxide (FIG. 8(b)), and the supplied copper ions are diffused into the source and drain electrodes (FIG. 8(c)). The diffused copper ions are supersaturated on the source and drain electrodes as well as on the insulating film ($SiO_2$) near them whereby they are precipitated as copper atoms, providing electrical connection between the source electrode and the drain electrode (FIG. 8(d)). At this time, if the copper thin film forming the gate electrode is thin, it is not possible to supply the copper ions necessary for precipitation of copper atoms. In other words, even as the gate voltage continues to be applied, the insulation of the gate electrode can be well held, because it is unlikely that there is a metal filament formed by which the gate electrode is coupled to the source electrode or the drain electrode. When the areas of the source and drain electrodes are equivalent to the gate electrode, the optimum value for the copper thin film was roughly 1/10 of the tantalum oxide film thickness. To put it another way, if tantalum oxide film thickness of 20 nano-meters is used in combination with the copper thin-film thickness of about 2 nanometers, on-off operation would be achievable while the insulation of the gate electrode is still maintained. Note here that even though the copper thin-film thickness is 0.1 nanometer or 10 nanometers, on-off operation could be achieved while the insulation of the gate electrode is still maintained. However, the gate voltage value for achieving that varies depending on the copper thin-film thickness as described later.

Comparative Example 3

The supersaturation of metal ions necessary for carrying out the invention is now explained with reference to FIG. 9.

More specifically, reference is made to what happens when there is too large a spacing between the source electrode and the drain electrode.

Figures 9A, 9B, 9C:
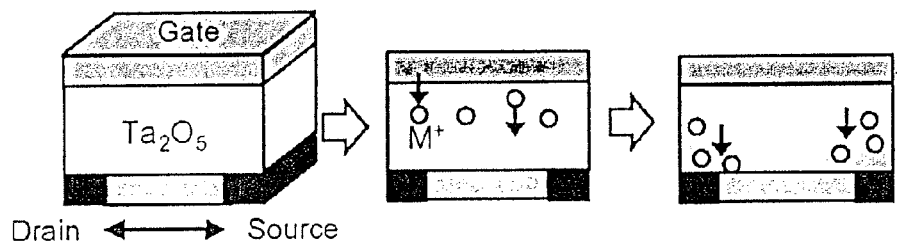
FIG. 9 is illustrative in schematic of the operation of the electrochemical transistor of Comparative Example 3 wherein there is a wide spacing provided between the source electrode and the drain electrode.
Figures 9D, 9E:
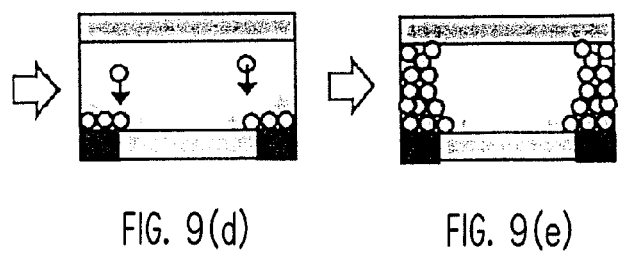

As shown in FIG. 9, a silicon oxide film ($SiO_2$) that is an insulator having a film thickness of 30 nanometers (in the direction indicated by a double action arrow in FIG. 9(a)) provides insulation between the source electrode and the drain electrode. The thickness of this insulator is set much larger than explained in Example 1. Formed on that assembly are a 30-nanometer thick tantalum oxide ($Ta_2O_5$) thin film and a copper gate electrode (FIG. 9(a)). As a positive gate voltage is applied to this device structure, it causes copper ions to be supplied from the gate electrode (FIG. 9(b)), and they are diffused toward the source electrode as well as the drain electrode. At this time, the diffusion of copper ions takes place along a potential gradient in the ion diffusion material (tantalum oxide); so when there is a wide spacing between the source electrode and the drain electrode as described herein, the concentration of copper ions grows high near the source and drain electrodes, but it does not in a wide intermediate area between both electrodes (FIG. 9(c)). Consequently, the supersaturation is only achieved near each of the source and drain electrodes, and copper atoms are precipitated only on each electrode and the insulator (silicon oxide film) near it with the result that connection taking place on the insulator in the wide spacing between the source electrode and the drain electrode slows down, or that connection does not occur at all (FIG. 9(d)). Even as additional copper ions are supplied, the precipitation of copper atoms occurs only on copper filaments growing from the respective electrodes; so even when there is a short circuit between the source or drain electrode and the gate electrode (FIG. 9(e)), electrical insulation still remains provided between the source electrode and the drain electrode.

With the conventional arrangement wherein precipitation occurs not by way of supersaturation as set forth in the prior art, a copper filament is allowed to grown in the lateral direction (the direction connecting the source electrode with the drain electrode) too, making it possible to achieve electrical connection between the source electrode and the drain electrode. Note here that the feature of that arrangement is that as explained with reference to Comparative Examples 1 and 2, there is no definite critical gate voltage value, because the gate voltage value for creating the on-state depends on the sweep speed of the gate voltage.

Example 5

While copper is used as the gate electrode material in the foregoing examples, it is to be understood that other material, for instance, silver may also be used as the gate electrode material. In this case, silver ions are supplied into the ion diffusion material so that supersaturation is achieved on the source/drain electrode side whereby they are precipitated in the form of silver atoms to make electrical connection between the source electrode and the drain electrode. Other than copper and silver, for instance, lithium may also be used, or these metals may be used in combinations of two or three instead of being used alone.

Figure 10A:
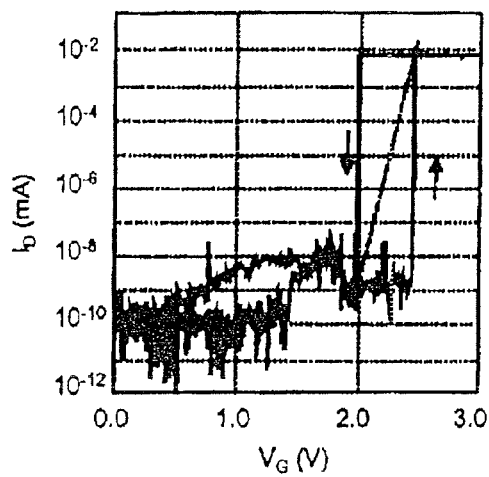
FIG. 10 is indicative of the results of operation of the electrochemical transistor of Example 5 according to the invention wherein silver is used instead of copper.

Shown in FIG. 10(a) are the results of operation of a device wherein a silver thin film has a thickness of 2 nanometers, a tantalum oxide film has a thickness of 20 nanometers, and a silicon oxide ($SiO_2$) film providing a separation and insulation between the source electrode and the drain electrode has a thickness of 10 nanometers. As the gate voltage is swept from 0 V up to 3 V, there is a sharp rise observed in the drain current at 2.4 V. As the gate voltage is swept from 3 V down to 0 V, on the other hand, there is a sharp decrease observed in the drain current at 2.0 V, which indicates that the volatile on-off operation is achieved.

Figure 10B:
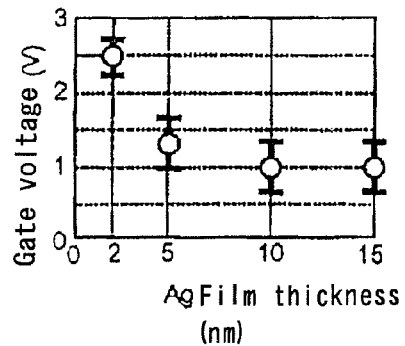
Figure 10C:
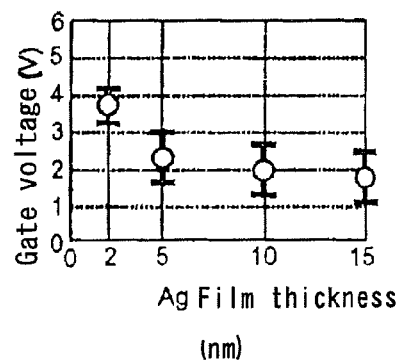

The gate voltage value necessary for such volatile operation was measured for a device comprising a tantalum oxide film having a thickness of 20 nanometers and a silicon oxide ($SiO_2$) film providing a separation and insulation between the source electrode and the drain electrode and having a thickness of 10 nanometers with silver thin films varying in thickness. The results are set out in FIG. 10(*b*). From those results, it is found that when the silver thin film has a small thickness, the critical electric field necessary for creating super-saturation, viz., the gate voltage grows large because of a decreased amount of silver ions capable of being supplied into the tantalum oxide. Likewise, the gate voltage value for creating the nonvolatile on-state was measured. Consequently, it is found that the necessary gate voltage value changes depending on the thickness of the silver thin film (FIG. 10(*c*)).

While, in the foregoing example, the thin film providing a silver or copper ion supply source is formed on the thin film of the ion diffusion material during device preparation, it is to be understood that such ions may be captured in the thin film of the ion diffusion material as by co-evaporation during film preparation. In short, it is essentially required for carrying out the invention that metal ions capable of creating super-saturation such as silver ions, copper ions, and lithium ions be present in the device structure.

In order from the metal ion supply source to be loaded beforehand in the thin film of the ion diffusion material, such metal ions should preferably be captured in the form of ions from the outset, but not in the form of atoms. Referring to tantalum oxide as an example, copper atoms (ions) are considered to be present as ions (rather than neutral atoms) in its lattice. If copper and tantalum oxide are concurrently formed in film form, it is then possible to form a thin film with copper contained as ion in tantalum oxide.

While, in the foregoing examples, tantalum oxide is used as the ion diffusion material, it is a matter of course that given the material capable of achieving the diffusion of metal ions, the invention could be carried out with the diffusion of ions other than tantalum oxide. By way of example but not by way of limitation, such an ion diffusion material includes metal oxides such as titanium oxide and tungsten oxide, and silicon oxide which may be used alone or in combinations of two, three or more.

APPLICABILITY TO THE INDUSTRY

As described above in details, the present invention successfully provides an electrochemical transistor that is best suited for on-off operation and easy to control with higher reliability than ever before.

What is claimed is:

1. An electrochemical transistor, comprising:
    an ion diffusion member,
    a gate electrode located on a first surface of said ion diffusion member, and
    a source electrode and a drain electrode located on a second surface of said ion diffusion member that opposes to said first surface with an insulator interposed between said source electrode and said drain electrode, wherein a gate voltage is applied to said gate electrode to diffuse metal ions in said ion diffusion member such that said metal ions are super-saturated on said source electrode and said drain electrode as well as on said insulator near said both electrodes to make electrical connection between said source electrode and said drain electrode by way of a metal precipitated by said supersaturation,
    wherein when a source/drain reference gate voltage lies in a positive first area, electrical connection is made between said source electrode and said drain electrode, and when said source/drain reference gate voltage is then changed over to a positive or zero second area lower than said positive first area, said electrical connection is eliminated by said first area of said source/drain reference gate voltage, and
    wherein when said source/drain reference gate voltage lies in a third area higher than said positive first area, nonvolatile electrical connection occurs.

2. An electrochemical transistor as recited in claim 1, wherein a thickness of said ion diffusion member between said first surface and said second surface is 40 nanometers or less.

3. An electrochemical transistor as recited in claim 1, wherein a material for said ion diffusion member is a metal oxide or a silicon oxide.

4. An electrochemical transistor as recited in claim 3, wherein said metal oxide is a titanium oxide, a tantalum oxide, and a tungsten oxide or a mixture thereof.

5. An electrochemical transistor as recited in claim 1, wherein said metal ions are one or more ions species of ions selected from silver ions, copper ions, and lithium ions.

6. An electrochemical transistor as recited in claim 1, wherein at least a part of said gate electrode is formed of copper or silver.

7. An electrochemical transistor as recited in claim 1, wherein said metal ions are such that metal atoms forming said gate electrode are ionized and supplied into said ion diffusion member.

8. An electrochemical transistor as recited in claim 1, wherein a spacing distance between said source electrode and said drain electrode is 20 nanometers or less.

9. An electrochemical transistor as recited in claim 8, wherein the spacing distance between said source electrode and said drain electrode ranges from 1 nanometer to 15 nanometers.

10. An electrochemical transistor as recited in claim 1, wherein one or more species of ions selected from silver ions and copper ions are contained beforehand as said metal ions in the material for said ion diffusion member.

11. An electrochemical transistor as recited in claim 1, wherein when said gate voltage lies in a positive area relative to said source electrode and said drain electrode, electrical connection and disconnection is made between said source electrode and said drain electrode.

12. An electrochemical transistor as recited in claim 1, wherein when said source/drain reference gate voltage defining said gate voltage lies in a positive area relative to said source electrode and said drain electrode, said nonvolatile electrical connection is made between said source electrode and said drain electrode, and when said source/drain reference gate voltage lies in a negative area, said nonvolatile electrical connection is eliminated.

13. An electrochemical transistor as recited in claim 1, wherein by application of a negative area of source/drain reference gate electrode, said precipitated metal is ionized and diffused in said ion diffusion member toward said gate electrode to eliminate said electrical connection between said source electrode and said drain electrode.

14. An electrochemical transistor as recited in claim 1, wherein an amount of said metal diffused in said ion diffusion member and precipitated on said drain electrode and said source electrode as well as on said insulator near said both electrodes is smaller than an amount of said metal conducting between said source electrode or said drain electrode and said gate electrode.

15. An electrochemical transistor, comprising:
- a multilayered structure having
    - a first insulator;
    - a source electrode;
    - a drain electrode;
    - a second insulator interposed between the source electrode and the drain electrode, wherein the source electrode, the drain electrode and the second insulator are stacked on the first insulator; and
    - a third insulator stacked on the source electrode, the drain electrode and the second insulator,
- wherein a side wall of said multilayered structure is formed with an ion diffusion member, and a gate electrode is further formed on the side wall thereof,
- wherein a gate voltage is applied to said gate electrode to diffuse metal ions in said ion diffusion member such that said metal ions are super-saturated on side surfaces of said source electrode, said drain electrode, and said second insulator to make electrical connection between said source electrode and said drain electrode by way of a metal precipitated by said supersaturation.

\* \* \* \* \*